United States Patent
Hayashi et al.

(10) Patent No.: US 10,813,217 B1
(45) Date of Patent: Oct. 20, 2020

(54) WIRING BOARD AND MANUFACTURING METHOD THEREOF

(71) Applicant: NGK SPARK PLUG CO., LTD., Nagoya-shi, Aichi (JP)

(72) Inventors: Takahiro Hayashi, Nagoya (JP); Tomoaki Mizutani, Nagoya (JP)

(73) Assignee: NGK SPARK PLUG CO., LTD., Nagoya (JP)

( * ) Notice: Subject to any disclaimer, the term of this patent is extended or adjusted under 35 U.S.C. 154(b) by 0 days.

(21) Appl. No.: 16/808,597

(22) Filed: Mar. 4, 2020

(30) Foreign Application Priority Data

May 15, 2019 (JP) .................. 2019-091823

(51) Int. Cl.
*H05K 1/11* (2006.01)
*H05K 1/03* (2006.01)
*H05K 3/40* (2006.01)

(52) U.S. Cl.
CPC .......... *H05K 1/111* (2013.01); *H05K 1/0306* (2013.01); *H05K 3/4007* (2013.01); *H05K 2201/09045* (2013.01); *H05K 2203/1126* (2013.01)

(58) Field of Classification Search
CPC .......... H05K 1/111–116; H05K 3/4007; H05K 3/4015; H05K 2201/09045; H05K 2201/09054
See application file for complete search history.

(56) References Cited

U.S. PATENT DOCUMENTS

| 5,684,677 | A | * | 11/1997 | Uchida | H05K 3/303 361/770 |
| 5,969,461 | A | * | 10/1999 | Anderson | H03H 9/059 310/313 R |
| 2015/0206850 | A1 | * | 7/2015 | Hsieh | B23K 1/0016 228/256 |
| 2017/0047261 | A1 | * | 2/2017 | Lu | H01L 23/24 |
| 2019/0206822 | A1 | * | 7/2019 | Park | H01L 21/4853 |

FOREIGN PATENT DOCUMENTS

JP 2015-225893 A 12/2015

* cited by examiner

*Primary Examiner* — Hoa C Nguyen
(74) *Attorney, Agent, or Firm* — Stites & Harbison, PLLC; Jeffrey A. Haeberlin; Gary N. Stewart

(57) ABSTRACT

Disclosed is a wiring board including: an insulating substrate; a plurality of connection terminals arranged on the insulating substrate; and a plurality of non-conductive protruding parts respectively arranged on areas of the insulating substrate except areas on which the plurality of connection terminals are arranged. The non-conductive protruding parts has a height greater than that of the connection terminals.

5 Claims, 8 Drawing Sheets

WIRING BOARD AND MANUFACTURING METHOD THEREOF

BACKGROUND

The present invention relates to a wiring board with a plurality of connection terminals and a manufacturing method thereof.

There is known a wiring board for mounting thereon an electronic component e.g. semiconductor element, which includes: an insulating substrate made of a non-conductive material such as a ceramic material, resin material or glass material; and a plurality of external connection terminals (also called "connection pads") made of a conductive material such as a metal material on the insulating substrate.

Japanese Laid-Open Patent Publication No. 2015-225893 discloses one such type of wiring board, including: an insulating substrate; a plurality of pad conductors disposed on a first main surface of the insulating substrate; a coating layer of non-conductive material covering from the first main surface of the insulating substrate to outer peripheral portions of the pad conductors. In this wiring board, center portions of the pad conductors exposed from the coating layer serve as connection pads, respectively. In other words, the coating layer defines the connection pads by covering the outer peripheral portions of the pad conductors. For example, the coating layer can be made of a ceramic, organic resin or glass material of the same kind as or a different kind from the insulating substrate.

SUMMARY

In the above-disclosed wiring board, the coating layer of non-conductive material is applied to the outer peripheral portions of the pad conductors. In this way, there are cases where the coating layer is formed to overlap and cover parts of the connection pads for the purpose of preventing damage to surfaces of the connection pads and entry of foreign matter between the connection pads. Such a layer structure is called an "overcoat structure". It is conceivable to form the overcoat structure by arranging the connection pads in a predetermined pattern on the insulating layer, and then, laminating the coating layer of non-conductive material (such as alumina) to cover from the insulating substrate to outer peripheral portions of the connection pads, whereby portions of the connection pads exposed from the coating layer serve as connection terminals for connection to other connection members such as solder balls.

In the overcoat structure, the actual diameter of the connection pads located under the coating layer is larger than the diameter of the exposed portions of the connection pads serving as the connection terminals. When it is demanded to narrow the intervals between the adjacent connection pads for high definition and miniaturization of the wiring board, the connection pads have to be located very close to each other under the coating layer.

However, the narrowing of the intervals between the adjacent connection pads raises difficulties in manufacturing process. The narrowing of the intervals between the adjacent connection pads also raises a high possibility of short circuit between the adjacent connection pads, which results in an increase of defective product rate.

In view of the foregoing, it is a main advantage of the present invention to provide a wiring board capable of protecting surfaces of connection terminals without narrowing the intervals between the adjacent connection terminals and to provide a method for manufacturing such a wiring board.

According to one aspect of the present invention, there is provided a wiring board, comprising: an insulating substrate; a plurality of connection terminals arranged on the insulating substrate; and a plurality of non-conductive protruding parts respectively arranged on areas of the insulating substrate except areas on which the plurality of connection terminals are arranged, the non-conductive protruding parts having a height greater than that of the connection terminals.

According to another aspect of the present invention, there is provided a manufacturing method of a wiring board, comprising: providing an insulating substrate in which a plurality of columnar parts are arranged, the columnar parts being made of a material having a lower thermal shrinkage rate than that of the insulating substrate; arranging connection terminals on areas of the insulating substrate except areas corresponding in position to the columnar parts; depositing a non-conductive material over the columnar parts on the insulating substrate; and heating or firing the insulating substrate on which the non-conductive material has been deposited, so as to allow the columnar parts to partially protrude from the insulating substrate due to a difference in thermal shrinkage rate between the insulating substrate and the columnar parts and thereby form protruding parts containing the non-conductive material.

The other objects and features of the present invention will also become understood from the following description.

DETAILED DESCRIPTION

Figure 1:
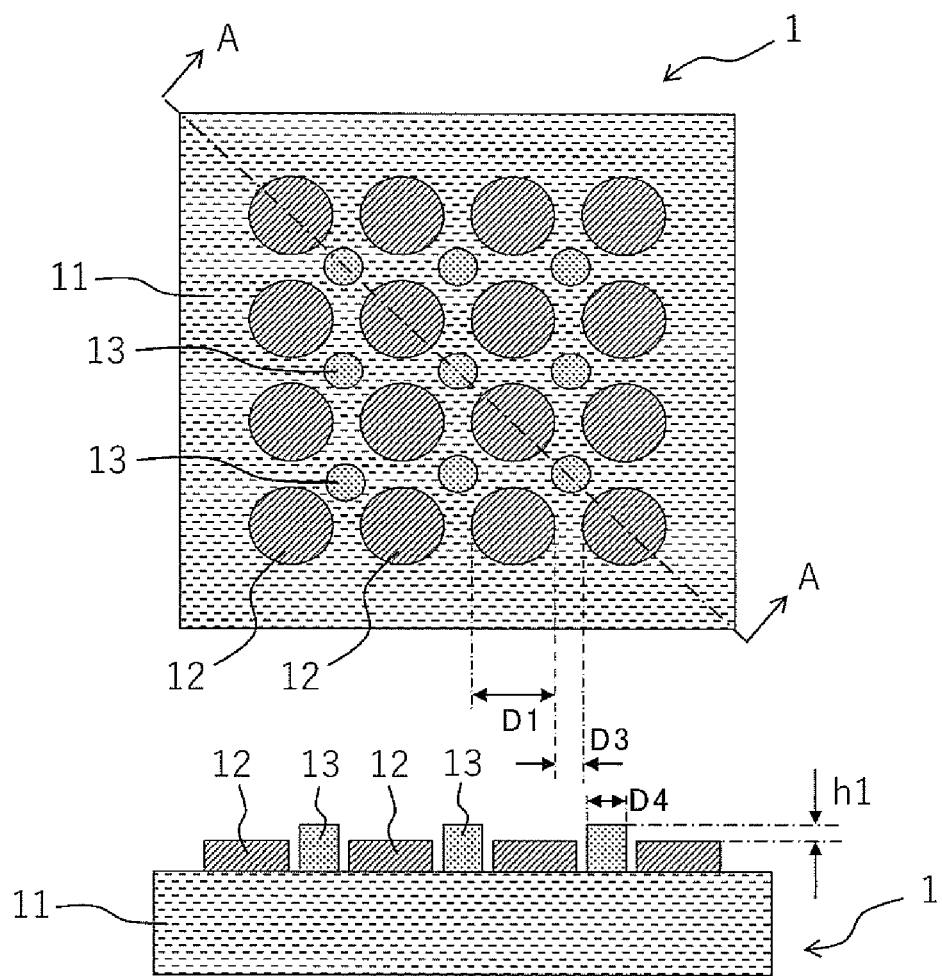
FIG. 1 is a plan view and cross-sectional view of a wiring board according to a first embodiment of the present invention.

Hereinafter, exemplary embodiments of the present invention will be described in detail below with reference to the drawings. In the following description, like parts and portions are designated by like reference numerals. These like parts and portions have the same names and functions. Thus, repeated explanation of the like parts and portions will be omitted herefrom. Further, the terms "upper", "lower", "under", "below", "above" etc. are used to describe relative locations of parts and portions as shown in the drawings.

First Embodiment

The first embodiment specifically refers to a wiring board 1 usable for various electronic devices.

(Configuration of Wiring Board)

FIG. 1 shows a configuration of the wiring board 1. The wiring board 1 is shown in plan in the upper part of FIG. 1. In the lower part of FIG. 1, the wiring board 1 is shown in cross section along line A-A.

As shown in FIG. 1, the wiring board 1 generally includes an insulating substrate 11, a plurality of connection pads 12 (as connection terminals) and a plurality of protruding parts 13 (as non-conductive protruding parts).

The insulating substrate 11 is made of an insulating material. In the first embodiment, the insulating substrate 11 contains a ceramic material as a predominant component. The term "predominant component" as used herein means a component whose content (in terms of wt %) is the highest among all components of the insulating substrate 11. Examples of the insulating material are a ceramic material containing alumina ($Al_2O_3$), a glass-ceramics composite material such as LTCC (low temperature co-fired ceramics) and the like. The insulating substrate 11 may have a laminated structure formed by laminating a plurality of insulating material layers (such as ceramic green sheets).

The plurality of connection pads 12 are arranged on an upper main surface of the insulating substrate 11. In the first embodiment, the connection pads 12 are aligned at substantially equal intervals in lengthwise and widthwise directions of the insulating substrate 11, that is, arranged two-dimensionally in a grid pattern. Thus, the conductive pads 12 are also called "BGA (ball grid array) pads", "LGA (land grid array) pads", "PGA (pin grid array) pads" etc.

Each of the conductive pads 12 is made of a conductive material. Examples of the conductive material are metal materials such as copper (Cu), silver (Ag), palladium (Pd), gold (Au), platinum (Pt), tungsten (W), molybdenum (Mo), nickel (Ni), manganese (Mn) and alloys thereof. These metal materials can be applied to the insulating substrate 11 by metallization, plating, deposition etc. The conductive pads 12 may contain an inorganic material such as glass or alumina in addition to the metal material.

In the case where the connection pads 12 are provided as metallization layers of tungsten (W), molybdenum (Mo) etc., it is feasible to form the connection pads 12 by e.g. kneading a powder of the aforementioned metal with an organic solvent and a binder, applying the resulting metal paste in a predetermined pattern onto a ceramic green sheet as the material of the insulating substrate 11 and then co-firing the ceramic green sheet and the applied metal paste. The application of the metal paste can be done by a conventionally known printing technique such as screen printing.

The plurality of protruding parts 13 are arranged on areas of the upper main surface of the insulating substrate 11 except areas on which the conductive pads 12 are arranged. In the first embodiment, the plurality of protruding parts 13 are arranged in such a manner that each of the protruding parts 13 is located between diagonally adjacent ones of the two-dimensionally arranged connection pads 12 as shown in the plan view of FIG. 1.

Each of the protruding parts 13 is made of a non-conductive material. In the first embodiment, the protruding parts 13 are each made of a ceramic material containing alumina ($Al_2O_3$). The protruding parts 13 are thus hereinafter also referred to as "alumina protruding parts 13". In the present invention, however, the material of the protruding parts 13 is not limited to the ceramic material. The protruding parts 13 may alternatively be made of any other non-conductive material such as resin material e.g. solder resist, glass-ceramics composite material e.g. LTCC, glass material, or the like.

As shown in the cross-sectional view of FIG. 1, the height of the alumina protruding parts 13 is greater than the height of the connection pads 12. Herein, the height of the alumina protruding part 13 means a distance from the upper surface of the insulating substrate 11 to an uppermost point of the alumina protruding part 13; and the height of the connection pad 12 means a distance from the upper surface of the insulating substrate 11 to an uppermost point of the connection pad 12. Accordingly, the distance from the upper surface of the insulating substrate 11 to the uppermost points of the alumina protruding parts 13 is greater than the distance from the upper surface of the insulating substrate 11 to the uppermost points of the connection pads 12. In the first embodiment shown in FIG. 1, the height of the alumina protruding parts 13 is greater by a distance h1 than the height of the connection pads 12.

In such a configuration, the alumina protruding parts 13 of greater height are arranged in the vicinities of the connection pads 12. The connection pads 12 are thus made unlikely to come into contact with other parts or members so that surfaces of the connection pads 12 can be protected by the alumina protruding parts 13.

Further, each of the alumina protruding parts 13 is formed in a vertically elongated column shape and is located between adjacent ones of the connection pads 12 at a distance away from the connection pads 12 so as not to interfere with the connection pads 12 in the first embodiment. This ensures the areas of arrangement of the alumina protruding parts 13 at locations outside of (different from) the areas of arrangement of the connection pads 12 while maintaining the intervals between the connection pads 12.

The correlation between the arrangement areas of the alumina protruding parts 13 and the intervals between the correction pads 12 will be explained in more detail below with reference to FIGS. 1, 2 and 9.

Figure 2:
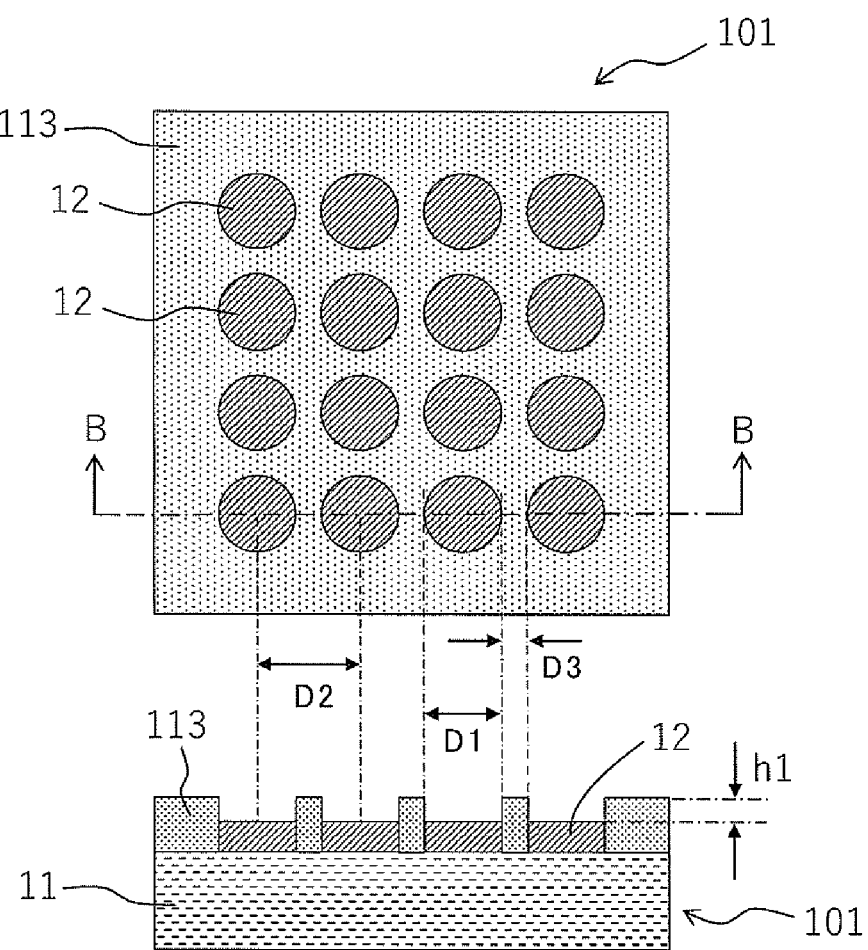
FIG. 2 is a plan view and cross-sectional view of a wiring board according to a modified example of the first embodiment.

FIG. 2 shows a wiring board 101 according to a modified example of the first embodiment. The wiring board 101 is shown in plan in the upper part of FIG. 2. In the lower part of FIG. 2, the wiring board 101 is shown in cross section along line B-B.

Figure 9:
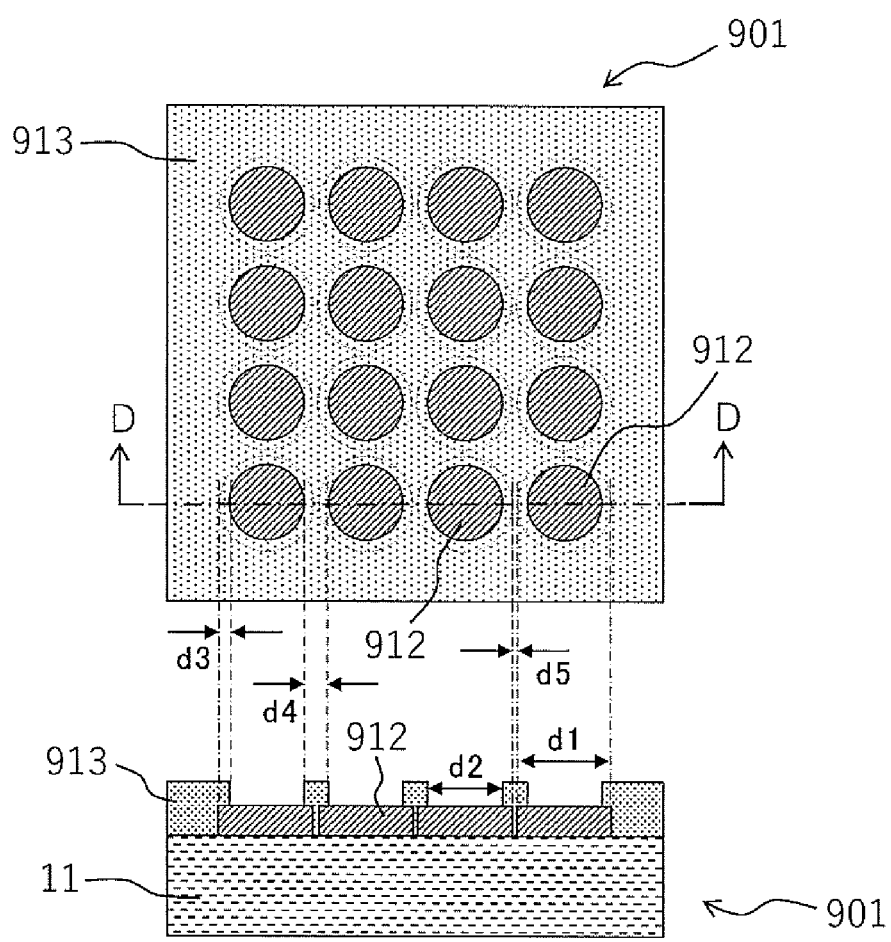
FIG. 9 is a plan view and cross-sectional view of a conventional wiring board.

FIG. 9 shows a configuration of the conventional wiring board 901. The wiring board 901 is shown in plan in the upper part of FIG. 9. In the lower part of FIG. 9, the wiring board 901 is shown in cross section along line D-D.

As shown in FIG. 9, the conventional wiring board 901 has connection pads 912 arranged on the insulating substrate 11, with a coating layer 913 of non-conductive material covering from the insulating substrate 11 to outer peripheral portions of the connection pads 912. The coating layer 913 is formed to overlap and cover parts of the connection pads 912 (see the cross-sectional view of FIG. 9) for the purpose of preventing damage to surfaces of the connection pads 912 and entry of foreign matter between the connection pads 912. The coating layer 913 is thus also called "overcoat layer". In the conventional example shown in FIG. 9, the overlap between the coating layer 913 and the outer peripheral portion of the connection pad 912 is provided with a width d3 (e.g. greater than or equal to 0.05 mm and smaller than or equal to 0.15 mm).

The coating layer 913 is formed by e.g. arranging the connection pads 912 in a predetermined pattern on the insulating substrate 11, and then, laminating the non-conductive material (such as alumina) on the insulating substrate to cover the outer peripheral portions of the connection pads 912. Then, portions of the connection pads 912 exposed from the coating layer 913 respectively serve as connection terminals for connection to other connection members such as solder balls.

In the conventional wiring board 901, the actual diameter d1 (e.g. 0.95 mm) of the connection pads 912 located under the coating layer 913 is larger than the diameter d2 (e.g. 0.75 mm) of the exposed portions of the connection pads 912 serving as the connection terminals. When it is demanded to narrow the apparent intervals d4 (e.g. 0.25 mm) between the adjacent connection pads 912 for high definition and miniaturization of the wiring board 901, the connection pads 912 have to be located very close to each other under the coating layer 913. In the conventional example shown in FIG. 9, the actual intervals between the adjacent connection pads 912 under the coating layer 913 are narrowed to a very small value d5 (e.g. 0.05 mm).

However, the narrowing of the actual intervals d5 between the adjacent connection pads 912 raises difficulties in manufacturing process. The narrowing of the actual intervals d5 between the adjacent connection pads 912 also raises a high possibility of short circuit between the adjacent connection pads 912, which results in an increase of defective product rate. Herein, the interval between the adjacent connection pads means a distance from an edge of one of two adjacent connection pads to an edge of the other of the two adjacent connection pads.

It is hence desirable to, as in the wiring board 101 shown in FIG. 2, to arrange a protection layer 113 of alumina etc. and connection pads 12 on the insulating substrate 11 with no clearance created therebetween. In the modified example shown in FIG. 2, the height of the alumina protection layer 113 is greater by a distance h1 than the height of the connection pads 12 as in the first embodiment shown in FIG. 1. Thus, the alumina protection layer 113 serve as non-conductive protruding parts to protect surfaces of the connection pads 12 in the wiring board 101.

In the case where, in the wiring board 101, the diameter D1 of the connection pads 12 is 0.75 mm; and the center-to-center distance D2 of the adjacent connection pads 12 is 1.00 mm, the actual interval D3 between the adjacent connection pads 12 is 0.25 mm. In this way, a certain amount of interval is ensured between the adjacent connection pads 12 so that the possibility of short circuit between the adjacent connection pads 12 is reduced in the modification example.

In the modified example shown in FIG. 2, however, it is required to perform patterning with very high positional accuracy for the formation of the connection pads 12 and the alumina protection layer 113. Such very high accuracy patterning is difficult to perform by a conventionally known printing technique etc.

In the first embodiment, on the other hand, each of the alumina protruding parts 13 is located between adjacent ones of the connection pads 12 at a distance slightly away from these adjacent connection pads 12 as mentioned above. In the case where the diameter D1 and center-to-center distance D2 of the connection pads 12 of the wiring board 1 are set to the same as those of the wiring board 101, the alumina protruding parts 13 can be located at some space away from the adjacent connection pads 12. Furthermore, the alumina protruding parts 13 can be formed with relatively easily realizable dimensions (e.g. diameter D4=0.35 mm).

(Modified Example)

Figure 3:
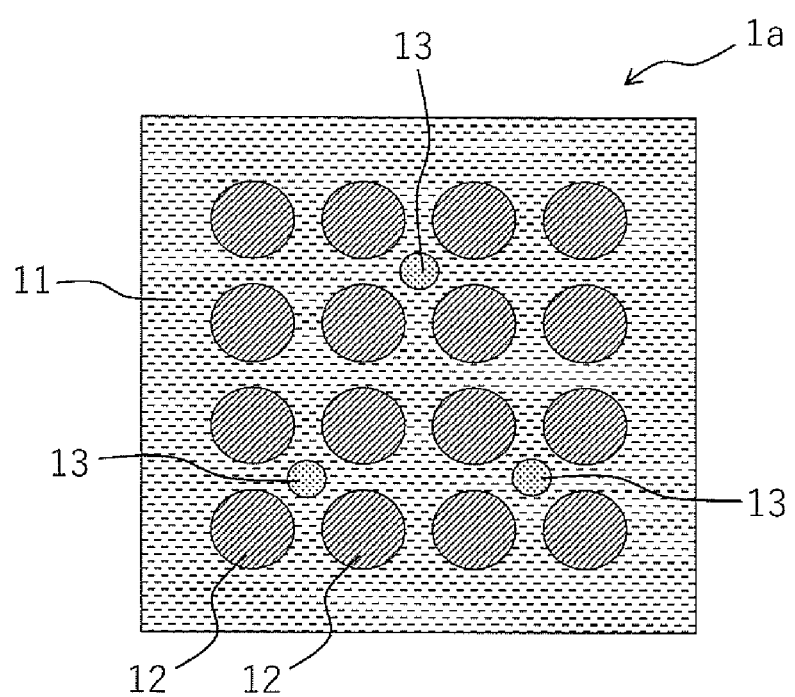
FIG. 3 is a plan view of a wiring board according to another modified example of the first embodiment.

FIG. 3 shows a wiring board 1*a* according to another modified example of the first embodiment.

In the first embodiment, the alumina protruding parts 13 are arranged on all of areas between diagonally adjacent ones of the connection pads 12 as shown in FIG. 1. The present invention is however not limited to such a configuration.

It suffices that the alumina protruding parts 13 are provided at least at three locations in a non-linear arrangement as in the wiring board 1*a* shown in FIG. 3. In this configuration, when a plurality of the wiring board 1*a* are stacked together, a lower surface of the upper-side wiring board 1*a* is supported by upper ends of the alumina protruding parts 13 of the lower-side wiring board 1*a* so as to prevent the upper-side wiring board 1*a* from coming into contact with the connection pads 12 of the lower-side wiring board 1*a* and thereby avoid damage to the connection pads 12 of the lower-side wiring board 1*a*. When the wiring board 1*a* is placed on e.g. a stage of component mounting equipment, the wiring board 1*a* is supported on the stage by contact of the alumina protruding parts 13 with a surface of the stage so as to avoid damage to the connection pads 12 of the wiring board 1*a*.

(Summary of First Embodiment)

As mentioned above, the wiring board 1 according to the first embodiment is characterized in that the alumina protruding parts 13 are arranged on the areas of the insulating substrate 11 except the areas on which the connection pads 12 are arranged and each has a height greater than that the connection pads 12. As the alumina protruding parts 13 of greater height than the connection pads 12 are arranged, the connection pads 12 are made unlikely to come into contact with other parts or members so that the surfaces of the connection pads 12 can be protected by the alumina protruding parts 13. Further, the arrangement areas of the connection pads 12 would not be narrowed by the arrangement of the alumina protruding parts 13 as the alumina protruding parts 13 are arranged at locations outside of the arrangement areas of the connection pads 12. The wiring board 1 therefore provides effective protection for the surfaces of the connection pads 12 without narrowing the intervals between the adjacent connection pads 12.

In particular, each of the alumina protruding parts 13 is arranged between adjacent ones of the connection pads 12 in the first embodiment. In such an arrangement, the alumina protruding parts 13 are located in the vicinities of the connection pads 12 so that the connection pads 12 can be more adequately protected by the alumina protruding parts 13. Moreover, the arrangement of the alumina protruding parts 13 between diagonally adjacent ones of the connection pads 12 makes it easy to ensure the arrangement areas (occupancy areas) of the alumina protruding parts 13 and thereby makes it possible to increase the diameter of the alumina protruding parts 13.

Although the alumina protruding parts 13 are circular-column shaped in the first embodiment as shown in FIG. 1, the shape of the alumina protruding parts 13 is not limited to the circular column shape. The alumina protruding parts 13 may have any other shape such as tapered column shape that gradually decreases in diameter toward the upper side (e.g. conical frustum shape, pyramidal frustum shape etc.).

Second Embodiment

The second embodiment specifically refers to a wiring board 201.

(Configuration of Wiring Board)

Figure 4:
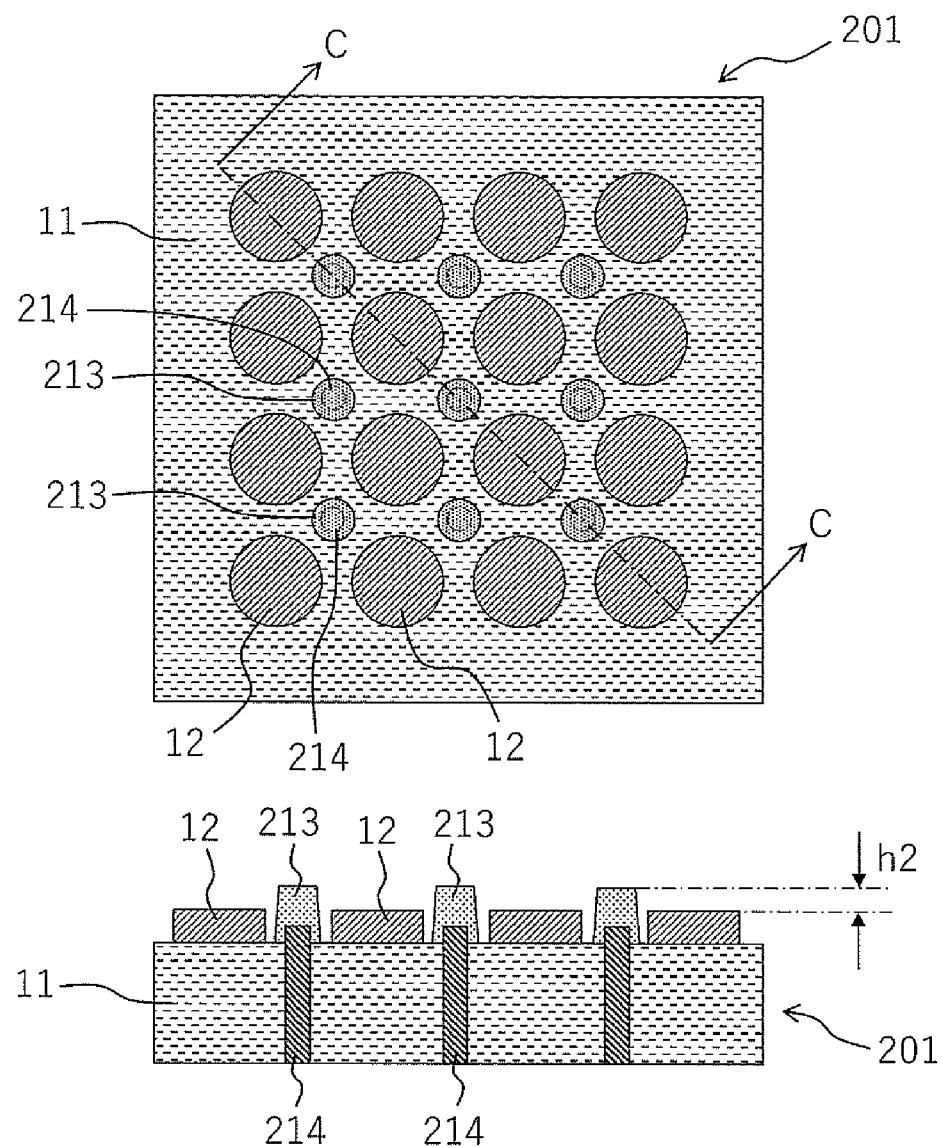
FIG. 4 is a plan view and cross-sectional view of a wiring board according to a second embodiment of the present invention.

FIG. 4 shows a configuration of the wiring board 201. The wiring board 201 is shown in plan in the upper part of FIG. 4. In the lower part of FIG. 4, the wiring board 201 is shown in cross section along line C-C.

As shown in FIG. 4, the wiring board 201 generally includes an insulating substrate 11, a plurality of connection pads 12 (as connection terminals), a plurality of protruding parts 213 (as non-conductive protruding parts) and a plurality of columnar parts 214. The insulating substrate 11 and connection pads 12 of the wiring board 201 according to the second embodiment are the same in configuration as those of the wiring board 1 according to the first embodiment.

The plurality of protruding parts 213 are arranged on areas of the upper main surface of the insulating substrate 11 except areas on which the conductive pads 12 are arranged. In the second embodiment, the plurality of protruding parts 213 are arranged in such a manner that each of the protruding parts 213 is located between diagonally adjacent ones of the two-dimensionally arranged connection pads 12 as shown in the plan view of FIG. 4.

Each of the protruding parts 213 is made of a non-conductive material. In the second embodiment, the alumina protruding parts 213 are each made of a ceramic material containing alumina ($Al_2O_3$) as in the first embodiment. The protruding parts 213 are thus hereinafter also referred to as "alumina protruding parts 213". In the present invention, however, the material of the protruding parts 213 is not limited to the ceramic material. As the material of the protruding parts 213, there can be used the same materials as those mentioned above as the material of the protruding parts 13 in the first embodiment.

As shown in the cross-sectional view of FIG. 4, the height of the alumina protruding parts 213 is greater than the height of the connection pads 12. Herein, the height of the alumina protruding part 213 means a distance from the upper surface of the insulating substrate 11 to an uppermost point of the alumina protruding part 213; and the height of the connection pad 12 means a distance from the upper surface of the insulating substrate 11 to an uppermost point of the connection pad 12. In the second embodiment shown in FIG. 4, the height of the alumina protruding parts 213 is greater by a distance h2 than the height of the connection pads 12.

The plurality of columnar parts 214 are arranged below the alumina protruding parts 213, respectively. More specifically, the columnar parts 214 are embedded in the insulating substrate 11 at positions corresponding to the alumina protruding parts 213, with upper end portions of the columnar parts 214 protruding from the upper surface of the insulating substrate 11 and being covered by the alumina protruding parts 213, as shown in the cross-sectional view of FIG. 4.

Each of the columnar parts 214 is made of a material having a lower thermal shrinkage rate than that of the insulating substrate 11. In the second embodiment, the insulating substrate 11 contains a ceramic material as a predominant component as in the first embodiment; whereas the columnar parts 214 contain as a predominant component a metal material lower in thermal shrinkage rate than the ceramic material. The term "predominant component" as used herein means a component whose content (in terms of wt %) is the highest among all components of the insulating substrate 11 or the columnar part 214. Examples of the metal material are copper (Cu), silver (Ag), palladium (Pd), gold (Au), platinum (Pt), tungsten (W), molybdenum (Mo) and manganese (Mn). The columnar parts 214 may be made of the same material as the connection pads 12.

As will be explained in detail below, the columnar parts 214 are caused to partially protrude from the surface of the insulating substrate 11 under the application of heat by firing during the manufacturing process of the wiring board 211 due to a difference in thermal shrinkage rate between the insulating substrate 11 and the columnar parts 214. With the protrusion of the columnar parts 214, the alumina protruding parts 213 located above the columnar parts 214 protrude to a greater height. As a result, a sufficient height of the alumina protruding parts 213 is ensured.

(Manufacturing Process of Wiring Board)

Figure 5:
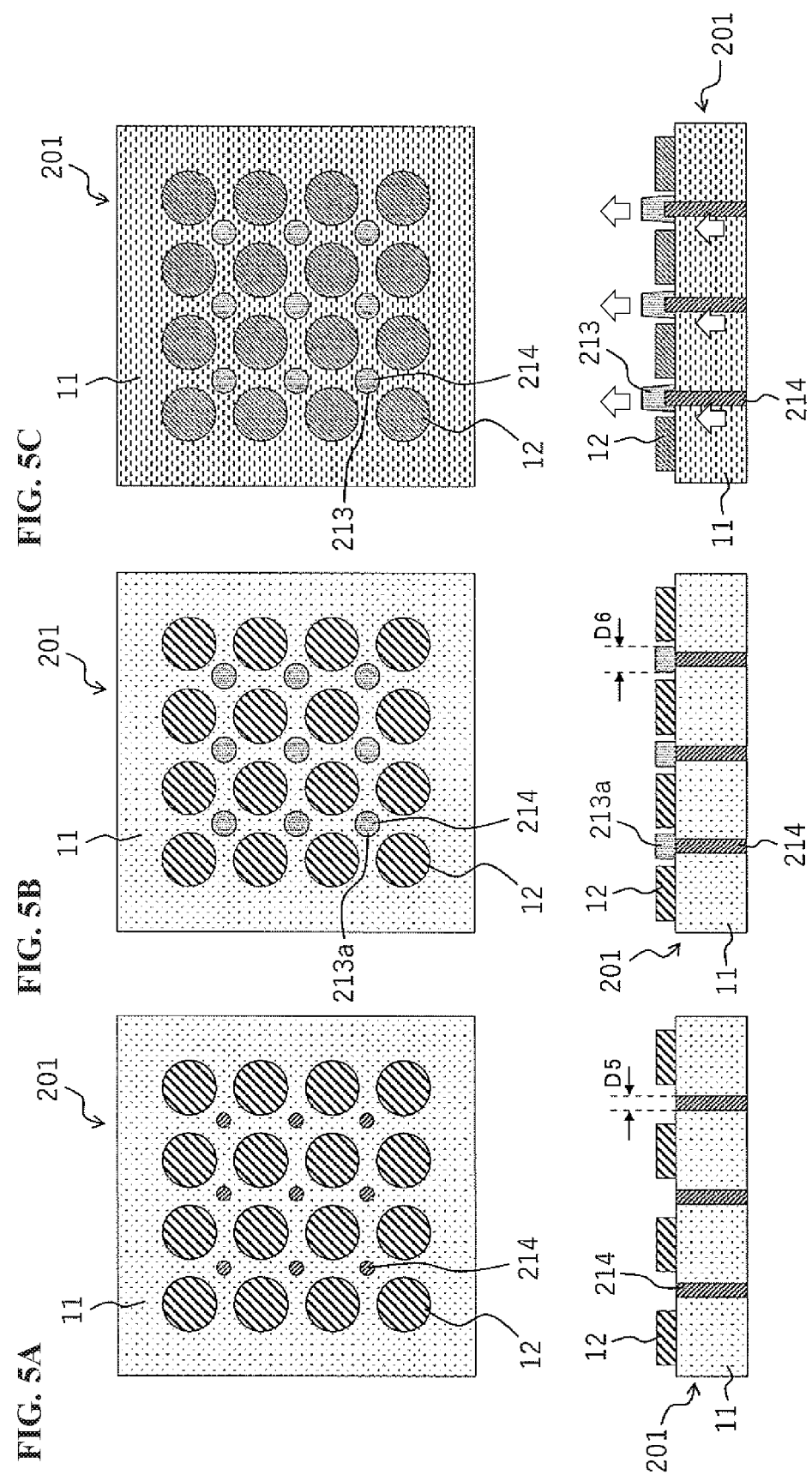
FIGS. 5A to 5C are schematic views of a process for manufacturing of the wiring board according to the second embodiment of the present invention.

FIGS. 5A to 5C show the respective steps of the manufacturing process of the wiring board 201.

First, the columnar parts 214 are arranged in the insulating substrate 11 at predetermined positions as shown in FIG. 5A. The predetermined positions correspond to the areas of the insulating substrate 11 on which the connection pads 12 are to be arranged in the subsequent step. At this time, the diameter D5 of the columnar parts 214 is set smaller than the diameter D6 of the alumina protruding parts 213 formed in the later step. Further, the upper surfaces of the columnar parts 214 are in flush with the upper surface of the insulating substrate 11 in the second embodiment.

Next, the connection pads 12 are formed and arranged on the predetermined areas of the insulating substrate 11. As mentioned above, the connection pads 12 can be formed by a conventionally known printing technique such as screen printing.

Subsequently, a non-conductive material 213a as the raw material of the alumina protruding parts 213 is deposited on the areas of the insulating substrate 11, except the areas on which the connection pads 12 are arranged, so as to overlap and cover the columnar parts 214 as shown in FIG. 5B. In the second embodiment, the ceramic material containing alumina ($Al_2O_3$) is used as the non-conductive material 213a as mentioned above. The non-conductive material 213a can be deposited by a conventionally known printing technique such as screen printing.

After that, the insulating substrate 11 in which the columnar parts 214 have been arranged and on which the non-conductive material 213a has been deposited is subjected to firing. The insulating substrate 11, the columnar parts 214 and the non-conductive material 213a undergo shrinkage under the application of heat by firing. Since the thermal shrinkage rate of the columnar part 214 is lower than the thermal shrinkage rate of the insulating substrate 11, the amount of shrinkage of the insulating substrate 11 is larger than the amount of shrinkage of the columnar part 214. Consequently, there occurs a change in configuration such that the columnar parts 214 partially protrude from the thermally shrunk insulating substrate 11 as shown by arrows in FIG. 5C. With such a configuration change, the non-conductive material 213a is pushed upward and thereby formed into protrusions. There are thus provided the alumina protruding parts 213. The thus-provided alumina protruding parts 213 have a circular column shape or a substantially conical frustum shape that decreases in diameter toward the upper side.

In the manufacturing process of the wiring board 201, the alumina protruding parts 213 are formed to protrude to a greater height than the connection pads 12 with the aid of a difference in thermal shrinkage rate between the material (e.g. ceramic material) of the insulating substrate 11 and the material (e.g. metal material) of the columnar parts 214 as mentioned above. The difference h2 between the height of the alumina protruding parts 213 and the connection pads 12 in the second embodiment is hence set larger than the difference h1 between the height of the alumina protruding parts 12 and the connection pads 12 in the first embodiment. As the difference h2 between the height of the alumina protruding parts 213 and the connection pads 12 in the second embodiment is set larger, it is more unlikely that the connection pads 12 will come into contact with other parts or members even under the influence of warpage or deformation of the wiring board 201 itself.

Each of the columnar parts 214 arranged in the insulating substrate 11 may be in multilayer form. In this case, the height of protrusion of the columnar part 214 from the surface of the insulating substrate 11 after the application of heat is made larger by setting the diameter D5 of the lower layer of the multilayer columnar part 214 larger. The height of protrusion of the columnar part 214 from the surface of the insulating substrate 11 after the application of heat is also made larger by using a metal material with a lower thermal shrinkage rate (e.g. a metal material lower in thermal shrinkage rate than the metal material of the connection pads 12) as the material of the columnar part 214.

In a modified example of the second embodiment, not only the columnar parts 214 but also additional (second) columnar parts may be provided inside the insulating substrate 11. For example, the second columnar parts serve as vias for connection of connection terminals to wirings inside the insulating substrate 11. Each of the second columnar parts is made of a conductive material such as metal material. In the case where the second columnar parts are provided, it is preferable to select and use as the material of the columnar parts 214 a material having a lower thermal shrinkage rate than that of the second columnar parts. By the selection and use of such materials, the height of protrusion of the columnar parts 214 from the surface of the insulating substrate 11 after the firing is made larger than that of the second columnar parts.

Third Embodiment

The third embodiment specifically refers to a wiring board 301. The wiring board 301 according to the third embodiment is structurally the same as the wiring boards 1 and 201 according to the first and second embodiments, except for the configuration of non-conductive protruding parts.

FIGS. 6, 7 and 8A to 8D show configuration examples of the non-conductive protruding parts.

Figure 6:
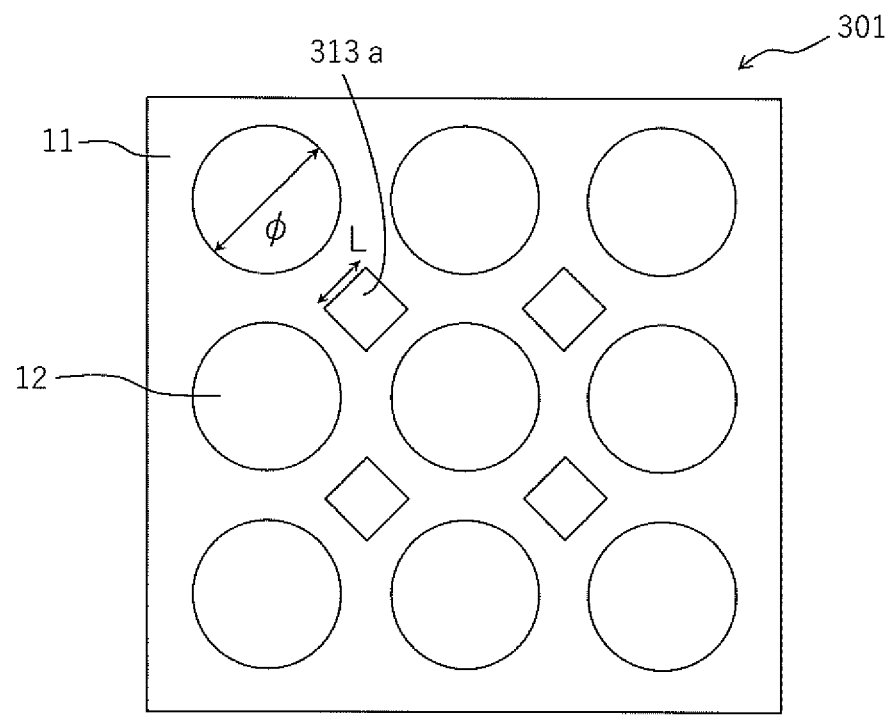
FIGS. 6 and 7 are schematic plan views of examples of a wiring board according to a third embodiment of the present invention.

In the example shown in FIG. 6, the non-conductive protruding parts provided are alumina protruding parts 313a having a square shape when viewed in plan. For instance, the diameter $\phi$ of the connection pads 12 is set to e.g. 0.75 mm; and the length L of one side of the square-shaped alumina protruding parts 313a is set to e.g. 0.30 mm.

Figure 7:
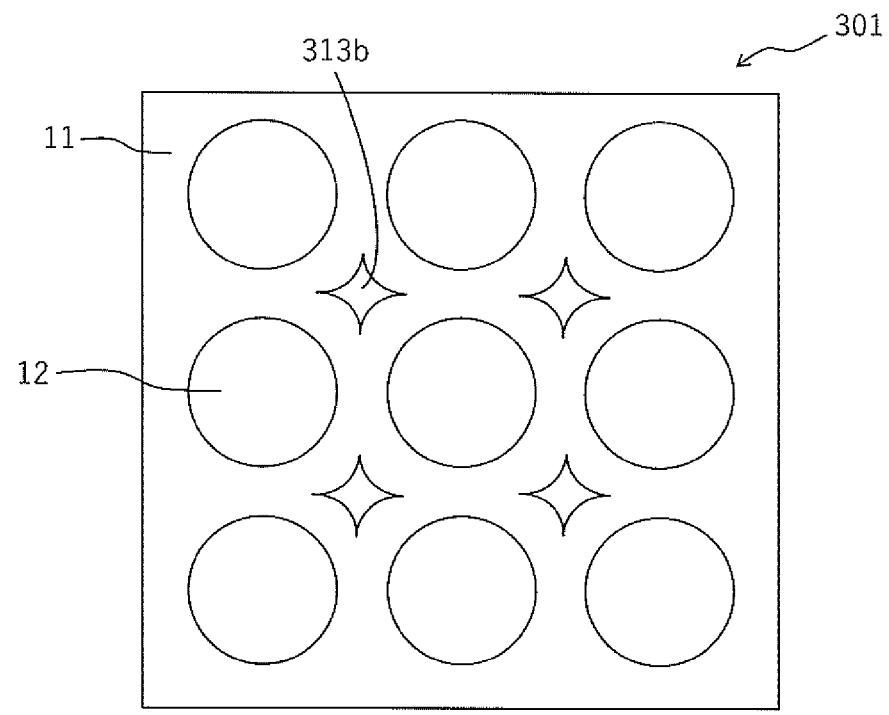

In the example shown in FIG. 7, the non-conductive protruding parts provided are alumina protruding parts 313b having an acute-angled square shape in plan view. In this case, the areas of arrangement of the alumina protruding parts 313b is ensured easily and reliably even when the intervals between the connection pads 12 is made narrower.

Figure 8A:
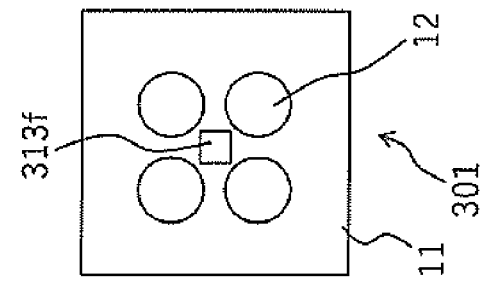
FIGS. 8A to 8D are schematic plan views of other examples of the wiring board according to the third embodiment of the present invention.
Figure 8B:
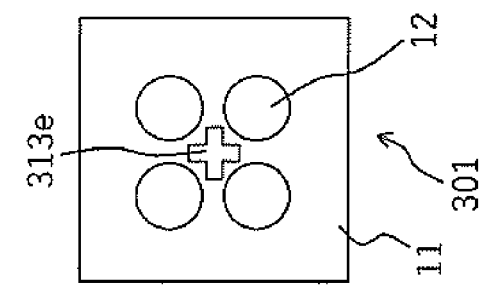
Figure 8C:
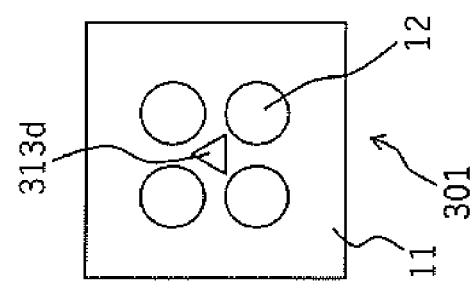
Figure 8D:
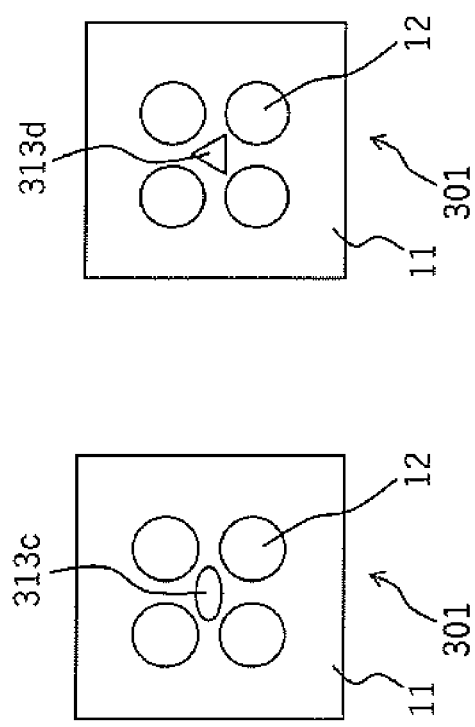

It is alternatively feasible to provide, as the non-conductive protruding parts, oval-shaped alumina protruding parts 313c as shown in FIG. 8A, triangular-shaped alumina protruding parts 313d as shown in FIG. 8B, or cross-shaped alumina protruding parts 313e as shown in FIG. 8C. As shown in FIG. 8D, it is feasible to provide square-shaped alumina protruding parts 313f in a different orientation from that of the square-shaped alumina protruding parts 313a shown in FIG. 6. The alumina protruding parts 313a, 313f may alternatively be rectangular in shape.

Although the present invention has been described above with reference to the specific embodiments and examples, the above-described embodiments and examples are intended to facilitate understanding of the present invention and are not intended to limit the present invention thereto. Various changes and modifications can be made to the above embodiments and examples without departing from the scope of the present invention. The present invention includes equivalents thereof and any combinations of the features of the above embodiments and examples.

The entire contents of Japanese Patent Application No. 2019-091823 (filed on May 15, 2019) are herein incorporated by reference. The scope of the present invention is defined with reference to the following claims.

The invention claimed is:

1. A wiring board, comprising:
an insulating substrate:
a plurality of connection terminals arranged on the insulating substrate;
a plurality of non-conductive protruding parts respectively arranged on areas of the insulating substrate except areas on which the plurality of connection terminals are arranged,
the non-conductive protruding parts having a height greater than that of the connection terminals; and
columnar parts respectively arranged under the non-conductive protruding parts, with portions of the columnar parts embedded in the insulating substrate, and made of a material having a lower thermal shrinkage rate than that of the insulating substrate.

2. The wiring board according to claim 1,
wherein each of the plurality of non-conductive protruding parts is located between adjacent ones of the plurality of connection terminals.

3. The wiring board according to claim 1,
wherein the plurality of non-conductive protruding parts are at least three non-conductive protruding parts and are in a non-linear arrangement.

4. The wiring board according to claim 1,
wherein the insulating substrate contains a ceramic material as a predominant component, and
wherein the columnar parts contain a metal material as a predominant component.

5. A manufacturing method of a wiring board, comprising:
providing an insulating substrate in which a plurality of columnar parts are arranged, the columnar parts being made of a material having a lower thermal shrinkage rate than that of the insulating substrate;
arranging connection terminals on areas of the insulating substrate except areas corresponding in position to the columnar parts;
depositing a non-conductive material over the columnar parts on the insulating substrate; and
heating or firing the insulating substrate on which the non-conductive material has been deposited, so as to allow the columnar parts to partially protrude from the insulating substrate due to a difference in thermal shrinkage rate between the insulating substrate and the columnar parts and thereby form protruding parts containing the non-conductive material.

* * * * *